(12) United States Patent
Peale et al.

(10) Patent No.: US 9,356,178 B2
(45) Date of Patent: May 31, 2016

(54) PLASMONIC PHOTOTRANSISTOR

(71) Applicant: University of Central Florida Research Foundation, Inc., Orlando, FL (US)

(72) Inventors: Robert Peale, Winter Park, FL (US); Masahiro Ishigami, Orlando, FL (US); Christian W. Smith, Winter Park, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 117 days.

(21) Appl. No.: 14/516,330

(22) Filed: Oct. 16, 2014

(65) Prior Publication Data

US 2015/0109606 A1 Apr. 23, 2015

Related U.S. Application Data

(60) Provisional application No. 61/892,718, filed on Oct. 18, 2013.

(51) Int. Cl.
*G01N 21/00* (2006.01)
*H01L 31/113* (2006.01)
*H01L 31/0232* (2014.01)
*G01J 1/42* (2006.01)

(52) U.S. Cl.
CPC ............... *H01L 31/1136* (2013.01); *G01J 1/42* (2013.01); *H01L 31/02327* (2013.01)

(58) Field of Classification Search
CPC ....... H01L 31/1136; G01J 1/42; G01N 21/64; G01N 21/65; G01N 21/87; G01N 21/8806; G01N 33/381; G01N 21/00
USPC .......................................................... 356/30
See application file for complete search history.

(56) References Cited

U.S. PATENT DOCUMENTS 8,344,358 B2 1/2013 Avouris et al.
2002/0021445 A1* 2/2002 Bozhevolnyi .......... B82Y 20/00
356/445

* cited by examiner

*Primary Examiner* — Abdullahi Nur
(74) *Attorney, Agent, or Firm* — Jetter & Associates, P.A.

(57) ABSTRACT

A plasmonic phototransistor includes a photon to surface-plasmon-polariton (SPP) transducer including and an optical coupling structure configured to receive incident light and an electrically conducting layer having a first and a second surface. The second surface is on the optical coupling structure and the first surface generates SPPs responsive to the incident light. A gate dielectric layer is on the first surface. A two dimensional (2D) electrically conductive material is on the gate dielectric layer having electrical properties sensitive to electromagnetic fields of the SPP. Source and drain contacts are on the 2D electrically conductive material. Dynamic electric fields of the SPPs reach the 2D electrically conductive material that are operable to electric field-induce modulation of an electrical conductance of the 2D electrically conductive material which is sensed from the source and drain contacts.

20 Claims, 5 Drawing Sheets

PLASMONIC PHOTOTRANSISTOR

CROSS REFERENCE TO RELATED APPLICATIONS

This application claims the benefit of Provisional Application Ser. No. 61/892,718 entitled "PLASMONIC PHOTOTRANSISTOR", filed on Oct. 18, 2013, which is herein incorporated by reference in its entirety.

STATEMENT REGARDING FEDERALLY SPONSORED RESEARCH

This invention was made with U.S. Government support under Contract No. FA8650-13-C-1528 awarded by the U.S. Air Force Research Lab (AFRL). The U.S. Government has certain rights in this invention.

FIELD

Disclosed embodiments relate to photo detectors and spectral sensing.

BACKGROUND

There are no fast, sensitive photodetectors with a narrow but broadly tunable bandwidth for applications including spectral sensing and situational awareness. Considerable effort has been made in this direction, including efforts by the U.S. Air Force Research Lab (AFRL), in the development of SPP photodetectors based on tunable plasmon resonances in the two-dimensional electron gas (2DEG) of grating-gated high electron mobility transistors (HEMTs). However, the detectable wavelengths have been limited to the low THz and mm-waves due to practical limitations on maximum sheet charge density and minimum grating period. Moreover, the strength and sharpness of the resonant absorption is low at room temperature due to limited electron relaxation times, so that such devices have required temperatures below about 20 K for proper operation.

SUMMARY

This Summary is provided to introduce a brief selection of disclosed concepts in a simplified form that are further described below in the Detailed Description including the drawings provided. This Summary is not intended to limit the claimed subject matter's scope.

Disclosed photodetectors comprise plasmonic phototransistors including a surface plasmon polariton (SPP) transducer including an electrically conducting layer that supports generation of SPPs and a light coupling structure (coupling structure) for matching a momentum of incoming photons to a momentum of the SPPs to allow photon-to-SPP transduction. The electric field of SPPs emanating from the electrically conducting layer is coupled to a transistor comprising a two-dimensional (2D) electrically conductive material, in which its carriers behave confined to 2D, of which charge carrier density can be modulated by electric fields of SPPs, such as graphene which is a single-atomic-layer of graphite. The concentrated, dynamic electric fields of the SPPs from the SPP transducer provide electric-field induced modulation of charge carriers in the transistor, which can be rectified at the source or drain electrodes and detected as DC current or voltage. Disclosed photodetectors have been found to provide a narrowband photo-response over a wide range of frequencies, which can be configured by choosing an appropriate SPP coupling structure to produce photodetectors operable in any desired spectral range from ultraviolet (UV) to mm-waves.

The coupling structure can comprise a prism coupler or a grating coupler. The electrically conducting layer is at least "semi-optically transparent." As used herein, a layer of material or a sequence of several layers of different materials is said to be optically "transparent" when the layer or layers permit at least 50% of the ambient electromagnetic radiation in relevant wavelength(s) to be transmitted through the layer or layers. Similarly, layers which permit at least 5% but less than 50% transmission of ambient electromagnetic radiation in relevant wavelength(s) are herein said to be "optically semi-transparent."

For the transistor used to detect the SPP generation, graphene can be substituted for by other 2D materials that have sufficiently high room temperature mobility, of which electrical conductivity can be modulated by the electric field of SPPs. Example 2D materials besides graphene including hexagonal boron nitride, transition metal dichalcogenides such as molybdenum disulfide ($MoS_2$) and tungsten disulfide ($WS_2$), and other 2D semiconductors such as gallium selenide, gallium sulfide, phosphorene, silicene and germanene.

BRIEF DESCRIPTION OF THE DRAWINGS

Reference will now be made to the accompanying drawings, which are not necessarily drawn to scale, wherein:

FIG. 6A is a scanned microscope image of an example graphene-based plasmonic phototransistor, while

DETAILED DESCRIPTION

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments.

One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments include plasmonic phototransistors which comprise a SPP transducer including a coupling structure such as an optical prism and an electrically conducting layer that is at least semi-transparent coupled to a phototransistor, where the transduced SPPs modulate the device properties of the phototransistor. The SPP transducer's electrically conducting layer comprises an at least semi-transparent metal or other electrically conductive materials such as conductive polymers (e.g., conjugated polymers, such as polythiophenes, polyacetylenes) having a first side that supports bound electromagnetic waves known as SPPs, and a second side opposite the first side in physical contact with the coupling structure such as an optical prism coupled to receive light from within the prism to excite SPPs on the electrically conductive layer.

The phototransistors comprise a 2D electrically conductive material which can be plasmonically modulated, such as graphene. Other 2D electrically conductive materials can include hexagonal boron nitride, molybdenum disulfide, molybdenum diselenide, molybdenum ditelluride, tungsten disulfide, tungsten diselenide, tungsten ditelluride, gallium selenide, gallium sulfide, phosphorene, silicene or germanene. The 2D electrically conductive material is separated from the first side of the semi-transparent electrically conductive layer of the SPP transducer by a dielectric layer referred to herein as a gate dielectric layer.

The refractive index of the gate dielectric layer is generally lower than the refractive index of the prism, and is always so when the gate dielectric is air. The gate dielectric layer may be a composite material, and may include an air gap as a portion. The graphene or other 2D material is on the gate dielectric layer. Source and drain contacts are on the graphene or other 2D material to allow sensing the electrical response of the transistor.

Figure 1A:
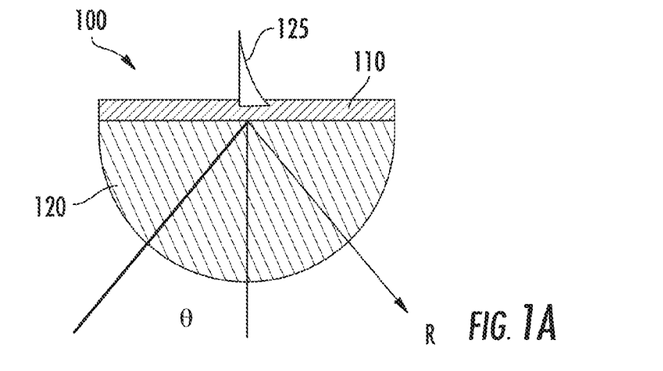
FIG. 1A is a cross-sectional schematic of an example SPP transducer for visible/NIR wavelengths.

FIG. 1A is a cross-sectional schematic of an example SPP transducer device 100 operable for visible/NIR wavelengths. In this embodiment the optical coupling structure comprises a prism. An electrically conductive layer 110 (e.g., a metal layer) that is at least semi-transparent is shown on the flat (plane) surface of the hemicylindrical prism 120, which can be about 50 nm of gold in one particular embodiment. Keeping the electrically conductive layer 110 thin, generally less than 200 nm, helps maintain high optical transmission for the electrically conductive layer 110. The angle of incidence for the light beam is shown as θ relative to the normal to the planar surface of the hemicylindrical prism 120, the reflected light reflected from the planar surface is shown as R, and the SPP generated by the electrically conductive layer 110 as 125. The hemicylindrical prism 120 can comprise a glass prism.

Figure 1B:
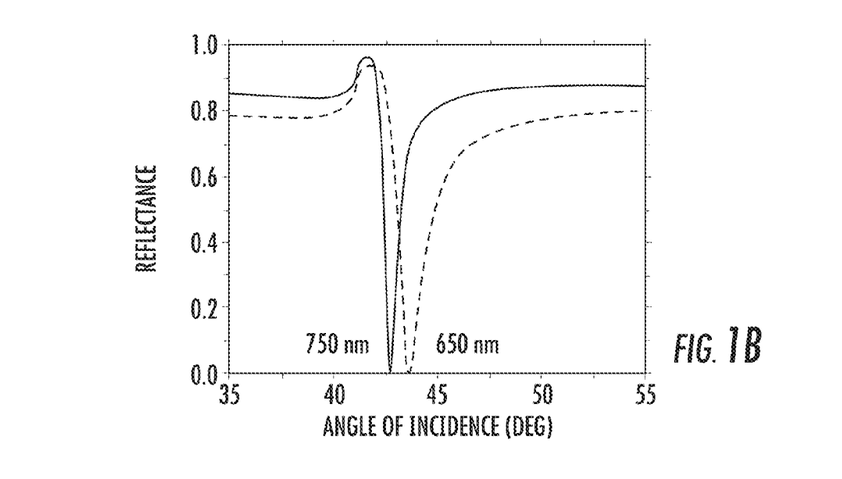
FIG. 1B is a calculated angular reflection spectrum as a function of angle of incidence showing resonances at specific angles of incidence for specific wavelengths of p-polarized light, and FIG. 1C provides measured resonance angles for unpolarized light, all according to example embodiments.
Figure 1C:
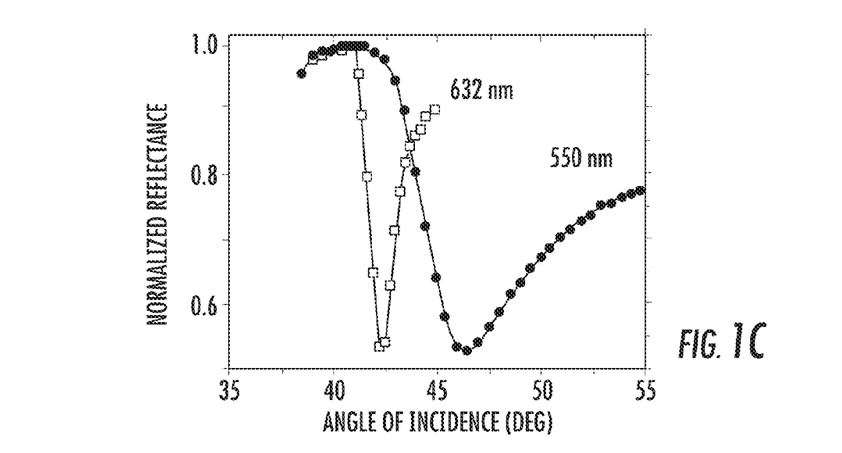

FIG. 1B is a calculated angular reflection spectrum showing resonances at specific incident angles for specific wavelengths for p-polarized (transverse magnetic, TM) light. FIG. 1C shows measured normalized reflectance vs. angle of incidence (in degrees) that reveals resonance angles for unpolarized light at two different example wavelengths (shown as 632 nm and 550 nm).

Regarding operation of the SPP transducer device 100 shown in FIG. 1A, light is incident on the cylindrical surface of the hemicylindrical prism 120 at angle θ penetrates into the hemicylindrical prism 120. An anti-reflective (AR) coating may be optionally provided on the surface of the hemicylindrical prism 120. The light is reflected at the plane surface, shown as R, which is coated with an electrically conductive layer 110 that as described above is generally thin. If the angle of incidence θ corresponds to the resonance angle, the SPP 125 shown is excited, and the intensity of R is reduced, as represented by the relatively thinner reflected ray R shown exiting the hemicylindrical prism 120 in FIG. 1A. The field of the SPP 125 is represented by a shape being an exponentially decaying distribution at the surface of the electrically conductive layer 110 shown in FIG. 1A. In reality the field distribution is generally spatially periodic along the interface with a wavelength that is smaller than the corresponding free space wavelength, and the SPP 125 propagates toward the right in FIG. 1A.

It is generally relatively easy to calculate the angular reflectance spectrum by using 3-layer Fresnel equations and the complex permittivity of the electrically conductive layer 110. FIG. 1B presents such a calculation for two different p-polarized visible wavelengths with an example 50 nm layer of gold for the electrically conductive layer 110 on a glass prism for the hemicylindrical prism 120. A perfect absorption resonance with 100% absorptivity (zero reflectance) is observed for each wavelength at different angles of incidence. In other words, essentially all of the energy from the incident radiation is converted to SPPs 125 at those wavelength-specific angles. Moreover, the field energy, which in the photon wave was diffuse, is concentrated near the surface for the SPP 125. The enhancement is typically by factors of more than two orders of magnitude compared to the energy of the incident radiation in free space, before entering the hemicylindrical prism 120.

FIG. 1C presents an experimental demonstration of the resonant absorption effect for the electrically conductive layer 110 comprising a 50 nm thick gold film on glass at 632 nm and 550 nm wavelengths. The data shown closely agrees with the calculation for the conditions of the experiment. The absorption profile including the resonances shown in FIG. 1C depends on metal thickness, incident polarization, and the refractive index of the glass or other prism material for the hemicylindrical prism 120. The metal thickness affects the depth of the absorption, with the maximum occurring around a skin depth of the material, while the refractive index of the material on each side of the metal film must be sufficiently dissimilar. For unpolarized light, the absorption is limited to about 50%, while for polarized light as described above the absorption can be near 100%. Thus, besides measuring the light intensity, disclosed photodetectors can also provide information about the polarization state of incident light.

Figure 2A:
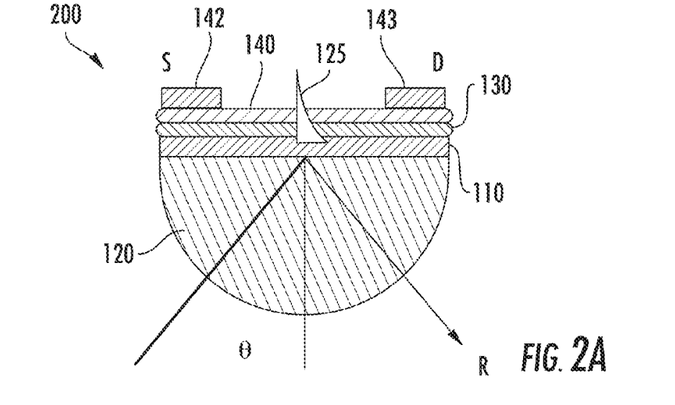
FIG. 2A is a cross-sectional schematic of an example plasmonic phototransistor that can function as a photodetector device for UV/visible/near-IR detection, according to an example embodiment.

FIG. 2A is a cross-sectional schematic of an example plasmonic phototransistor 200 that can function as a photodetector device for UV/visible/near-IR detection that includes a graphene-based FET comprising a 2D electrically conductive material 140 such as graphene on a SPP transducer device, for example the SPP transducer device 100 shown in FIG. 1A. The hemicylindrical prism 120 with an electrically conductive layer 110 thereon shown for the SPP transducer device 100 in FIG. 1A now has gate dielectric layer 130 shown on the side of the electrically conductive layer 110 opposite the hemicylindrical prism 120. In one embodiment, the gate dielectric layer can comprise Poly(methyl methacrylate) (PMMA), which is a spin-coatable dielectric polymer that can be used as a protective layer to encapsulate the 2D electrically conductive material 140 of the transistor while mounting the prism.

Figure 2B:
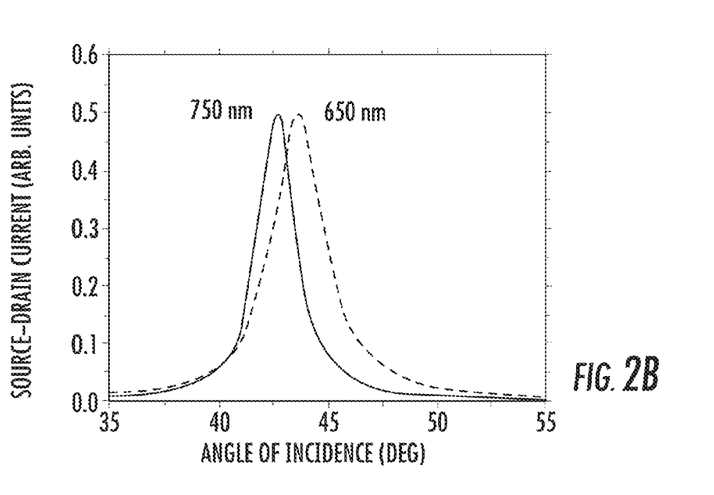
FIG. 2B is the hypothesized photoresponse (source-drain current vs. angle of incidence) of the plasmonic phototransistor depicted in FIG. 2A.

The 2D electrically conductive material 140 is on the gate dielectric layer 130 that has a source contact 142 and drain contact 143 thereon, such as metal contacts, which are generally deposited on the 2D electrically conductive material 140. Excitation of SPPs 125 for a given wavelength occurs at a given angle of incidence, which is different for each wavelength. Strong AC fields associated with the SPP 125 are bound to the surface of the electrically conductive layer 110 and penetrate into the gate dielectric layer 130/2D electrically conductive material 140/air region to distances on the order of the wavelength. This unidirectional propagation of the SPP 125, which is a bound electromagnetic wave, is recognized to be able to excite a unidirectional flow of charge polarization along the 2D electrically conductive material 140 such as a graphene layer, which can be rectified by nonlinearity at the source contact 142 or at the drain contact 143, giving rise to a measureable DC current or voltage. FIG. 2B is the hypothesized photoresponse (source-drain current vs. angle of incidence) for the plasmonic phototransistor 200 depicted in FIG. 2A acting as a photodetector at 750 nm and at 650 nm.

In operation of disclosed plasmonic phototransistors such as plasmonic phototransistor 200, photodetection proceeds via the combination of two transduction steps. First, photons incident on the second side of the electrically conductive layer 110 from within the hemicylindrical prism 120 are converted with a relatively high efficiency to SPPs 125, which exist on the first side of the electrically conductive layer 110 of the SPP transducer. Then, the SPP fields extend through the gate dielectric layer 130 to produce a measurable perturbation on the carrier transport (e.g., electrical conductivity) of the 2D electrically conductive material 140, where in the case of graphene high-speed changes result due to graphene's high room-temperature carrier mobility and light-like speeds for information transfer via SPP propagation. The gate dielectric layer 130 can comprise an air gap, such as an air gap created by spacers at the boundary of the active region of the transistor (see FIG. 5A described below).

SPPs 125 will be excited at a specific angle of incidence for a given incident photon frequency, and generally intense SPP fields will penetrate the gate dielectric layer 130, and dynamically dope and excite traveling waves of charge density in the 2D electrically conductive material 140, causing changes in its electrical conductance by a variety of potential mechanisms that can be sensed electrically by contacting terminals of the transistor structure. By suitable choice of the electrically conductive layer 110 that supports the SPP 125, and of the optical coupler design, the resulting 2D electrically conductive material 140 plasmonic phototransistor mechanism may be adapted for wavelengths that range from UV to mm-waves.

In particular, disclosed 2D material-based plasmonic phototransistors are generally adaptable to the entire infrared and THz region, and can in one embodiment comprise a 2D array of disclosed graphene plasmonic phototransistors to form the basis for tunable high-speed imaging arrays. Such arrays comprise a plurality of disclosed plasmonic phototransistors all with slightly different optical coupling structure geometry (e.g., different prism geometry) on a common substrate, to provide photodetection at a plurality of different angles of incidence. By placing a plurality of plasmonic phototransistors at slightly different incident angles, or with differently shaped prisms to have incident radiation enter these plasmonic phototransistors with differing incident angles, only specific plasmonic phototransistors of the array will respond.

Figure 2C:
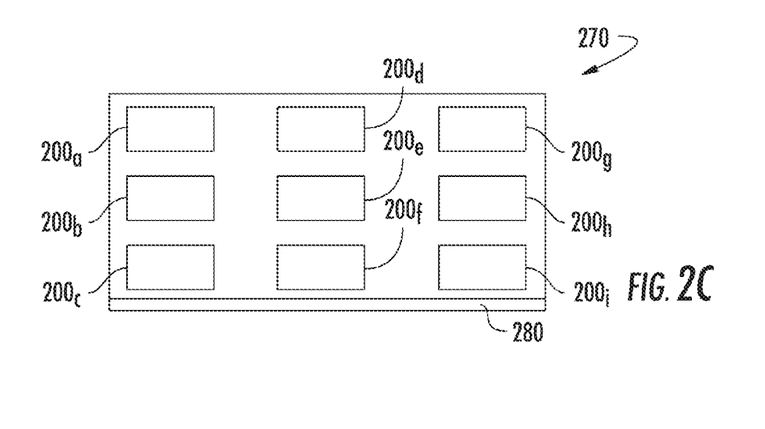
FIG. 2C depicts an array of plasmonic phototransistors shown as blocks which are each analogous to plasmonic phototransistor 200 shown in FIG. 2A shown, all on a common substrate, according to an example embodiment.

FIG. 2C depicts an array 270 of plasmonic phototransistors 200 shown as blocks which are each analogous to plasmonic phototransistor 200 shown in FIG. 2A shown in FIG. 2C as 200a, 200b, 200c, 200d, 200e, 200f, 200g, 200h, 200i all on a common substrate 280. The array 270 can perform as the plasmonic phototransistors can each have a slightly different prism geometry, to provide photodetection at a plurality of different angles of incidence.

Disclosed embodiments thus can combine plasmonics and 2D electrically conductive materials such as graphene technology. This combination overcomes the known limitations of graphene-based bolometers, which generally have limited sensitivity. Disclosed plasmonic phototransistor-based photodetectors yield highly selective, wavelength-tunable, fast, and sensitive photodetectors for UV to mm-wave radiation, and have the unique property of being both a detector and a spectrometer with utility for applications including, but not limited to, spectral sensing and spectral imaging.

Regarding the two transduction steps, the first is the conversion of incident photons to SPPs. The second step is the perturbation of the electrical properties of the 2D conductive material such as graphene by the SPP fields. The first step provides the wavelength selectivity over broad wavelength range from UV to mm-waves and the means of tunable detection over design-selected wave bands. The second step enables the conversion of electromagnetic energy to an electrical photo response that capitalizes on the high mobility and dynamic doping capabilities of 2D conductive materials such as graphene.

Methods of converting photons to SPPs are generally known. Incident photons within a narrow wavelength range are absorbed with up to essentially 100% efficiency when they excite bound electromagnetic waves at a suitably-structured electrically conducting surface. Other wavelengths are strongly reflected. The fields of the bound electromagnetic waves, known as SPPs, are confined to distances from the surface less than the wavelength of the same-frequency photons. Local intensities are sufficient to induce non-linear phenomena such as second harmonic generation. Couplers can be prisms for visible/near IR, as described above, or gratings, which are generally used for IR-to-mm-waves. In either case, the frequency of the photons that may be converted to SPPs generally depends strongly on the type of conductor and the incidence angle. In both types of coupling structures, the incidence angle can be used to tune resonance conditions by modification of momentum matching. The plasma frequency is material dependent ranging from UV and visible (for metals such as Al, Pt, Pd, and Au), to near IR (for e.g. metal silicides), to mid-IR (for semimetals), to THz and beyond (for doped semiconductors and electrically conducting (e.g., conjugated polymers).

The SPP generated in the coupling structure enhances the electric field of incoming photons by factors typically being by several hundred. These intense SPP AC electric fields will permeate the 2D conductive material such as graphene, situated on top of the coupling structures separated by a thin (typically sub-micron) gate dielectric. Such fields will locally perturb the electron concentration in the 2D conductive material, forming a unidirectional traveling wave of electron concentration in phase with the SPP wave. The presence of the generated SPP wave can be detected by measuring the impact of such perturbation on transport properties of the 2D conductive materials, such as the source-drain current.

Grating couplers for exciting plasmons in two-dimensional electron gases (2DEGs) within semiconductor heterostructures are known for detection for low THz frequencies and mm wavelengths. However, small carrier densities along with achievable grating periodicity limit the adaptability of this approach to wavelengths beyond the sub-mm regime. Moreover, the poor room-temperature mobility (short electron relaxation time) of these traditional 2DEGs necessitates cryogenic operating temperature to achieve sharp resonances and to observe resonant electrical effects. Other known optoelectronic technologies, based on gate-tunable plasmon frequencies of graphene, operate only at THz frequencies and are hampered by weak bolometric response of graphene at room temperature or by vanishing absorptivity of graphene. These limitations are essentially removed by disclosed plasmonic phototransistors.

In disclosed approaches, bulk conductors (e.g., gold) rather than 2DEGs are used to support resonantly-excited SPPs. Thus, one can tune the plasma frequencies from UV to mm-waves by choosing the composition of the electrically conducting layer 110 of the coupling structure. Moreover, the excited SPP fields in turn couple to the 2D electrically conductive material 140 such as graphene. For example, the graphene carrier density may be directly modulated via the field doping effect, thus converting SPP field energy into a change in graphene conductance. Graphene's high room temperature mobility eliminates the need for the cryogenic temperatures.

Regarding an example visible to Near-IR coupler, for coupling of UV/visible/near-IR radiation into SPPs, the Kretschmann method may be used [See Erwin Kretschmann, "Die Besitmmung optischer Konstanten von Metallen durch Anregung von Oberflaechenplasmaschwingungen," Z. Physik 241, 313 (1971), 15]. A hemicylindrical or isosceles prism has its flat base surface coated with about 1 skin depth of the desired electrical conductor (e.g., 50 nm of gold). Light is incident on the conductor from within the prism, whose refractive index slows the light down for purposes of momentum matching. Under angles of incidence beyond the critical angle for total internal reflection (TIR), the evanescent fields of the photonic wave penetrate and excite an SPP on the outer (free) surface of the conductor. For an SPP to be created at the photon frequency, the in-plane component of the photonic momentum needs to match (or closely match) the SPP momentum at that frequency. This can only occur for a specific angle of incidence. This incidence angle dependence is used to derive frequency selectivity.

For a disclosed infrared to mm-wave coupler, such as for the infrared, the coupling device used is generally a grating, rather than a prism. Prisms generally work poorly in the IR due to complications from the high refractive indices typical of IR transparent materials. To form an infrared coupler, a patterned substrate generally made of any material may be coated with an optically thick layer of the desired electrical conductor, whose plasma frequency lies in the spectral range of interest.

Figure 3A:
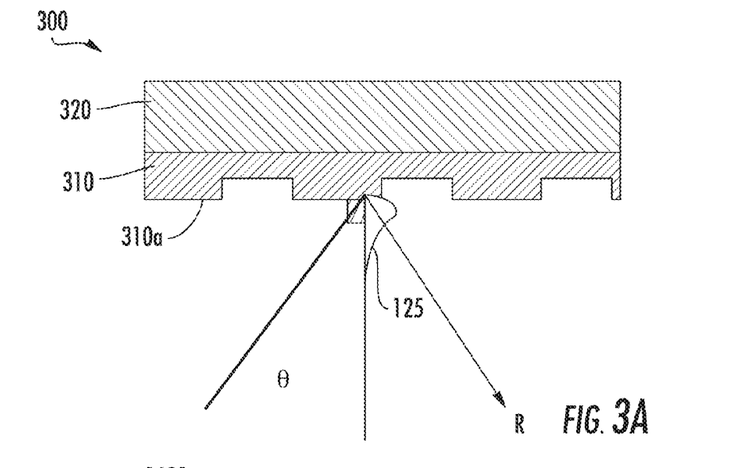
FIG. 3A is a cross-sectional schematic of an example grating coupler for excitation of infrared (IR) SPPs.
Figure 3B:
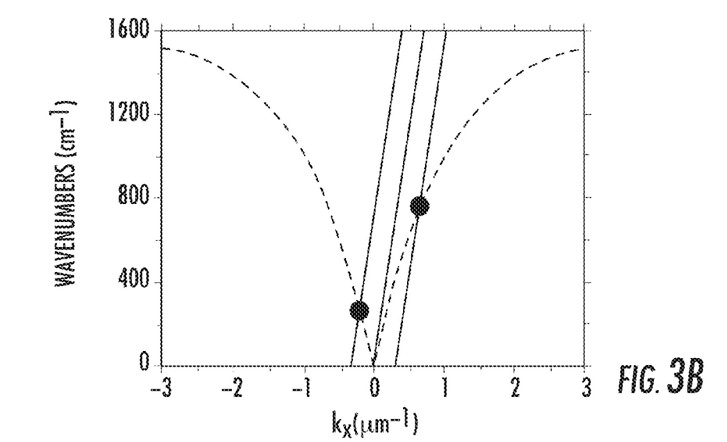
FIG. 3B is a plot showing the principle for excitation of SPPs by a grating according to an example embodiment.
Figure 3C:
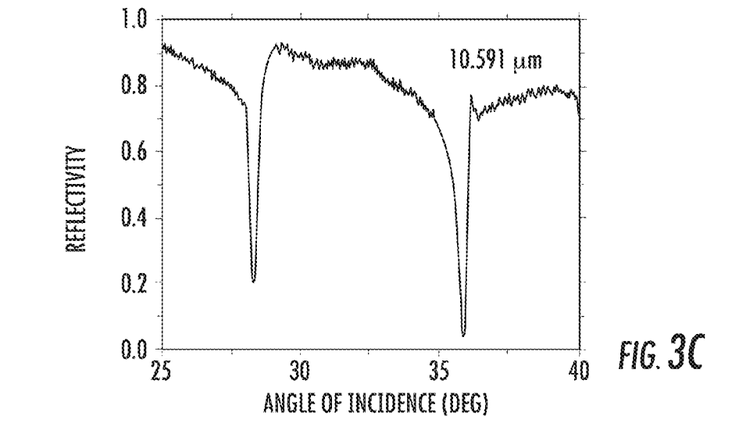
FIG. 3C presents experimental data for a Ag grating having a 20 micron period, 1 micron amplitude, and for a $CO_2$ laser wavelength of 10.591 micron.

FIG. 3A is a cross-sectional schematic of an example grating coupler 300 for excitation of IR SPPs shown as SPP 125 comprising a periodic grating (grating) 310 comprising raised features 310a that have a spacing that defines a period on a substrate 320. The box to the left of SPP 125 shown in FIG. 3A and FIG. 4A described below indicates that line immediately to the left of SPP 125 is a surface normal perpendicular to the device surface. FIG. 3B is a plot showing the principle for excitation of SPPs by a grating. Straight lines are 45-deg-incidence light lines, which have been shifted horizontally with respect to each other by one unit of grating wavevector. Dispersion curves for positive and negative going SPPs are also plotted. Solid symbols indicate conditions of momentum matching where excitation of SPPs by incident light can occur. For the given angle of incidence, resonant excitation of SPPs can occur at two different photon frequencies in the example of FIG. 3B. Correspondingly, for a monochromatic light source, SPPs can be excited at two (or more) angles of incidence. FIG. 3C shows such excitation resonances measured as reduced reflectivity for a p-polarized light from a $CO_2$ laser on a silver lamellar grating having a 20 micron period and 1 micron amplitude.

Light is incident on the grating and excites SPPs at certain angles of incidence that depend on the conductor properties of the material comprising the grating 310 and grating's period. In contrast to the optical prism coupler shown in FIG. 1A, multiple absorption resonances may be observed for the grating coupler 300. The reason for this difference is that while the prism slows the incident light down by a fixed amount to achieve momentum matching with the excited SPP, the grating 310 achieves momentum matching by adding or subtracting integral multiples of the fundamental grating wavevector. Another difference for the grating 310 compared to the optical prism coupler is that the excited SPPs may travel in either direction (left or right), depending on the conditions of momentum matching. This feature of grating coupler 300 has applications of making a dual wavelength detector via design asymmetry. By adding or subtracting multiples of the grating wavevector, this coupling element has the benefit of exciting higher order plasmonic modes. The characteristic absorption not only happens for the first order SPP mode, but also for other orders, allowing for the detection of multiple wavelengths with a single detector.

FIG. 3B which shows wavenumbers as a function of wavevector (k) explains how the grating coupler 300 functions. Dispersion curves are plotted for SPPs traveling in positive and negative x directions. The straight line shown that intersects the origin is the dispersion curve for light at an angle of incidence of 45 deg. When the angle of incidence is increased, this line tips to the right until a minimum slope of c is achieved for grazing incidence. The prism coupler works by decreasing the slope of this straight line to a minimum value of $c/n_{prism}$ without shifting the SPP curve, which allows a single point of intersection for positive-going SPPs. The other two straight lines shown in FIG. 3B are obtained from the first by shifting horizontally by plus and minus one unit of grating wavevector=$2\pi/\alpha$, where $\alpha$ (here 20 microns) is the grating period. In this way, multiple points of intersection with the SPP curves are obtained for the same angle of incidence but at different frequencies. One of the possible excitations indicated by the symbols in FIG. 3B is of a SPP moving toward positive x, while the other moves toward negative x. Alternatively, for a monochromatic source, two (or more) resonances can occur at different angles of incidence.

FIG. 3C presents experimental reflectivity vs. angle of incidence data for the periodic grating 310 being a Ag grating having a 20 micron period on a silicon substrate 320, 1 micron amplitude grating feature height, and for a $CO_2$ laser wavelength of 10.591 micron. One of the resonances shown at about a 36 degree angle of incidence corresponds to a positive-going SPP with one unit of grating wavevector added for momentum conservation. The other resonance shown at about a 28 degree angle of incidence corresponds to excitation of a negative going SPP with 3 units of grating wavevector subtracted.

To obtain tight IR SPP field confinement, having good overlap with the atomically thin 2D electrically conductive material such as a graphene layer, generally involves electrical conductors with infrared plasma frequencies for the grating 310. Gratings fabricated from metal silicides, semimetals, doped semiconductors, and conducting polymers that provide infrared plasma frequencies are known.

Figure 4:
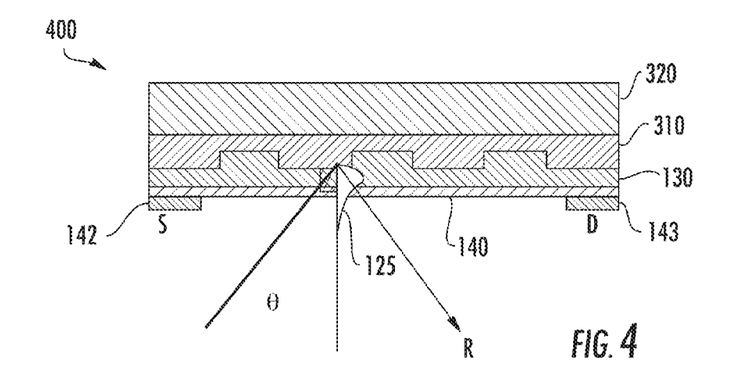
FIG. 4 is a cross-sectional schematic of an example grating coupled graphene-based plasmonic phototransistor for longer wave IR applications according to an example embodiment.

FIG. 4 is a cross-sectional schematic of an example completed grating coupled graphene-based plasmonic phototransistor 400 for longer wave IR applications. Here the 2D electrically conductive material 140 (e.g., a graphene layer) with contacts 142, 143 thereto can be deposited onto a gate dielectric layer 130 comprising an IR transparent insulating gate dielectric. Otherwise, the architecture is similar to the plasmonic phototransistor 200 shown in FIG. 2A, and the same mechanisms of exciting electrical response in the 2D electrically conductive material 140 such as a graphene layer apply here, also.

The layers below the substrate 320 shown are the grating 310 comprising an electrical conductor, a gate dielectric layer 130 such as PMMA, and then the 2D electrically conductive material 140 such as a graphene layer. At a 10 micron wavelength, the period of the grating 310 is ~20 microns, and the grating depth ~1 micron, which can be conveniently fabricated in substrates 320 such as silicon or glass by conventional photolithography and wet or dry etching. The pattered substrate can then be coated with a suitable conductor having IR plasma frequency for tight SPP field confinement. In this way, a grating 310 comprising an electrically conductive material is formed on top of a patterned substrate 320 of arbitrary electrical and optical properties, where the substrate 320 performs merely a mechanical function.

As noted above, an air gap may be included as a portion of the gate dielectric layer 130. Air is beneficial to device operation, particularly in the case of the prism coupler, because air has a low refractive index that approaches the refractive index of a vacuum. Disclosed below is an example method to form a gate dielectric layer 130 for a disclosed plasmonic phototransistor that includes an air gap. In the case of the grating coupler, there are generally no restrictions on the refractive index of the gate dielectric as there are for the prism, where the refractive index of the dielectric should be lower than that of the prism. However, there may still be advantages in the case of the grating coupler to have an air layer as part of the gate dielectric, because air avoids dielectric losses that trend to broaden the SPP excitation resonances.

An air gap may be formed by using electron beam lithography or photolithography with a shadow mask to perform an etch that selectively places a dielectric standoff such as comprising $SiO_2$ on the corners or sides of the prism or grating or substrate of the 2D conductor. Then a combination of pressure and/or solution based methods may be used to bond the transistor to the prism or grating, where the dielectric standoffs create an air-gap of appropriate thickness. Cyanoacrylate (or other adhesive) can be used to glue the parts in place by applying a small amount to the outer corners or edges of the prism or grating. Optical inspection can be used to determine if any regions of the prism face have not properly formed an air gap. Standard acetone processing can be used to dismount the prism to repeat the mounting.

Figure 5A:
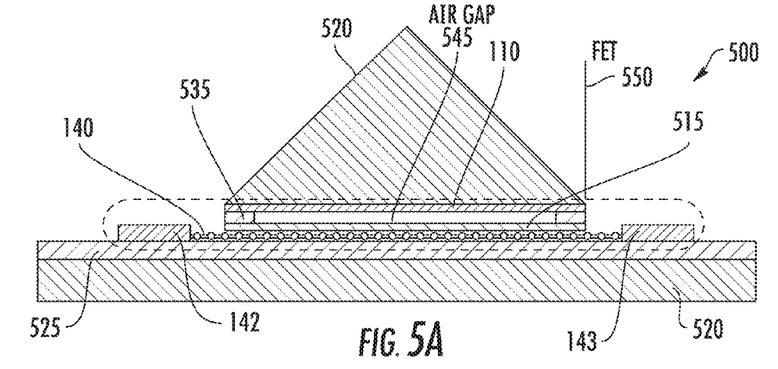
FIG. 5A is a cross-sectional schematic of an example prism-coupled graphene-based plasmonic phototransistor having a gate dielectric layer comprising an air gap, according to an example embodiment.

FIG. 5A is a cross-sectional schematic of an example prism-coupled graphene-based plasmonic phototransistor 500 shown including a FET 550 that has a 2D electrically conductive material 140 on gate dielectric layer comprising a dielectric layer 515 shown as a PMMA layer 515 with an air gap 545 on top. The prism coupler (in the Kretschmann configuration) includes prism 520 and electrically conductive layer 110 (e.g., a Au or Ag layer). Spacers 535, such as has 500 nm thick $SiO_2$ spacers, are shown between the electrically conducting layer 110 and the PMMA layer 515 that defines the air gap 545 which provides an air-gap separation of the 2D electrically conductive material 140 of the FET 550 from the electrically conducting layer 110 which provides the emitting surface of metal surface-plasmon host.

The FET 550 sits on top of a substrate 520 shown as p-doped silicon which can be heavily doped having a dielectric layer 525 such as a 300 nm $SiO_2$ layer thereon. The dielectric layer 515 being a PMMA layer being over the 2D electrically conductive material 140 functions as a protective layer by encapsulating a portion of the 2D electrically conductive material 140. The 2D electrically conductive material 140 has a source contact 142 and drain contact 143 thereon, such as metal contacts for enabling the measuring of photo-induced current or voltage. The FET 550 may have a channel width of 250 μm and a channel length (distance from source contact 142 to drain contact 143) of 8 mm.

Figure 5B:
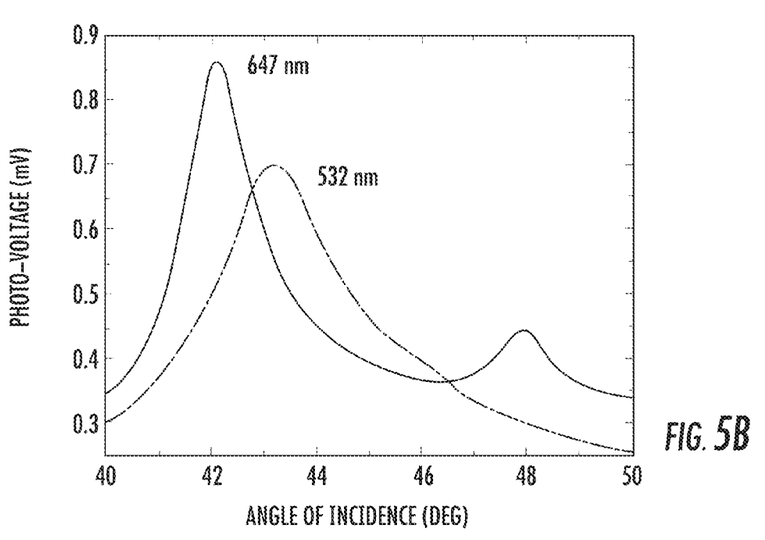
FIG. 5B shows the experimental photo-voltage response of prism-coupled graphene-based plasmonic phototransistor of FIG. 5A to light of 647 nm and 532 nm wavelengths through a range of angle of incidence, according to an example embodiment.

FIG. 5B shows the experimentally measured response of the prism-coupled graphene-based plasmonic phototransistor 500 of FIG. 5A to light of 647 nm and 532 nm wavelength through a range of incidence angles. Resonances corresponding to a maximum in the generated photo voltage for FET 550 are clearly shown for each wavelength at a particular angle of incidence.

EXAMPLES

Disclosed embodiments are further illustrated by the following specific Examples, which should not be construed as limiting the scope or content of this Disclosure in any way.
Fabrication and Characterization of Couplers Prism couplers analogous to those described above for SPP transducer device 100 shown in FIG. 1A were fabricated by purchasing isosceles right-angle prisms and evaporating a suitable electrical conductor layer on the plane surface, using conventional deposition methods such as electron beam evaporation. Grating couplers were fabricated by standard photolithography. Photoresist was spun onto silicon or glass substrates, exposed to UV light through a contact mask, and developed. The resulting pattern in photoresist serves as an etch mask for reactive ion etching (RIE) or wet etching. Lamellar gratings were so formed. The appropriate conductor is then coated to several skin depths by evaporation. The skin depth is determined from known optical constants and verified by Fourier transform infrared spectroscopy (FTIR) transmission measurements using double-side-polished silicon substrates.

Resonance depths, line shapes, and angular positions were characterized by measuring specular reflection as a function of incidence angle. Monochromatic light sources, a motor driven goniometer, a detector, and a LABVIEW program to record the data were used. The light source may be pulsed or chopped, and the signal may be synchronously amplified using a boxcar averager or lock-in amplifier. The light sources were generally p-polarized to provide the strongest resonances.

Graphene Growth

Graphene was grown by chemical vapor deposition (CVD) on copper or deposited using mechanical exfoliation. Exfoliation produces only small sheets reaching 10 µm to 100 µm in size. On the other hand, CVD-graphene can be centimeter-sized, lending itself better for applications. Graphene grown using the CVD method can be transferred to any given surface by etching it from copper. The defect and impurity density of the CVD-grown graphene are determined using Raman spectroscopy by monitoring the intensity ratio between the D and G band and their wavenumber positions.

Fabrication of Graphene-Based Phototransistors

In order to fabricate graphene-based phototransistors with SPP couplers as the AC gate, two different example methods can be used.

The first method requires assembly of a plasmonic coupler and graphene FET. Graphene is first transferred to appropriate substrates such as a silicon wafer with 280 nm thermal oxide. Graphene FETs are then contacted using stencil mask lithography, capped with a planarizing 60 nm layer of PMMA. Insulating (dielectric) standoffs are deposited in such a way as to allow an air gap of several hundred nanometers to separate the SPP supporting electrically conducting layer on the prism and the PMMA capped graphene, to ensure conditions for SPP excitation are maintained. FETs are then mounted and glued down to the metallized prism to complete graphene phototransistors.

In the second method, a gate dielectric layer is directly deposited on the coupling surfaces, graphene sheets transferred onto the gate dielectric layer, and finally metal source and drain contacts are formed on the graphene layer. Silicon oxide, aluminum oxide, hexagonal boron nitride (h-BN), or an air-gap can be used as examples gate dielectrics. The properties of the dielectric needed are that it be electrically insulating and that its refractive index be less than that of the prism, in the case that a prism coupler is used (the air gap was used as part of the gate dielectric in the first reduction to practice by the first method to achieve the low index requirement).

Silicon oxide can be deposited using electron beam evaporation and aluminum oxide can be deposited using a combination of thermal evaporation and subsequent oxidation of aluminum. Deposition of these dielectric layers can follow standardized wafer-fabrication procedures well known in the semiconductor industry. h-BN layers, which has been used to fabricate ultra-high quality graphene devices, can be mechanically exfoliated on top of the coupling structures by adapting published procedures. Similar ultra-high quality graphene devices can be made by suspending graphene on top of the grating structure, benefiting from the intrinsic air-gap that forms as the gate dielectric. h-BN and air-gap-based devices can be used to demonstrate the ultimate performance limitations of the disclosed device technology. Graphene can be either transferred or exfoliated on top of these dielectric layers. The quality of the delivered graphene sheets can be determined using Raman spectroscopy and delivery procedure can be tailored to yield graphene sheets with few defects and impurities. Once graphene is delivered on gate dielectric, standard lithography techniques, such as stencil, optical, and electron beam lithography, can be employed to deposit source and drain contacts on graphene. Field effect mobility of the fabricated graphene plasmonic phototransistors can be measured by using the conducting optical coupling structures as the gate electrode.

Figure 6A:
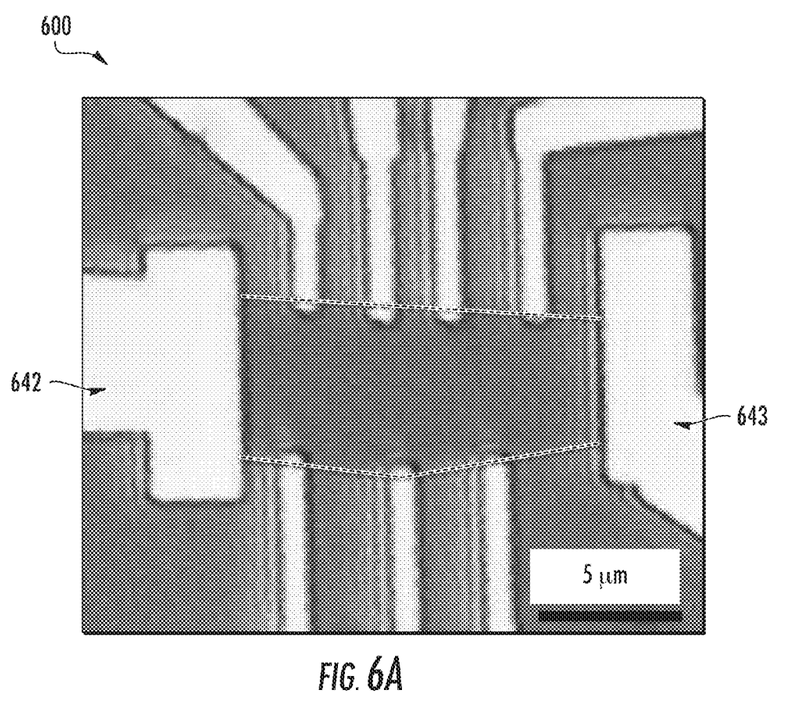

The example scanned image of a graphene-based plasmonic phototransistor 600 shown in FIG. 6A had 280 nm thick silicon oxide as the gate dielectric material. The source contact is shown as 642 and the drain contact as 643, and the associated voltage probe electrodes are in the Hall configuration. The gate contacts to the graphene and to the substrate (for a ground plane) are not visible in the scanned image. The electric field applied to the graphene material under the gate is based on the voltage difference between gate contacts and the ground plane, so that the applied electric field at the surface of the graphene is this voltage difference divided by the 280 nm silicon oxide gate oxide thickness.

Figure 6B:
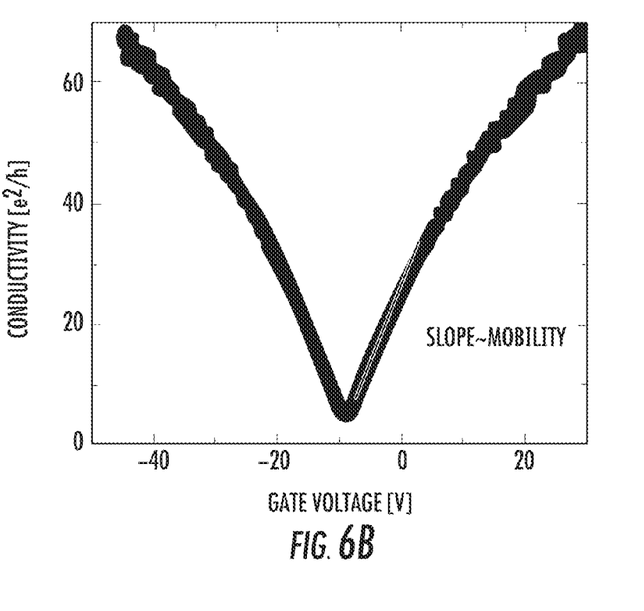
FIG. 6B shows an electric field gating effect on the electrical conductivity of the graphene-based plasmonic phototransistor, according to an example embodiments.

FIG. 6B shows the gating effect on the conductance of the graphene-based transistor by showing the measurement of the electrical response of the graphene-based plasmonic phototransistor 500 as a function of gate voltage. Clearly, a gate voltage of 2 V suffices to cause a measureable change in the conductance of the graphene. This corresponds to applied electric fields of $7 \times 10^6$ V/m. Laser excited plasmon fields may exceed $10^{11}$ V/m. SPP fields excited by reflected light from ordinary targets would be smaller, and may not lead to observable doping effects. However, other mechanisms are available to provide an electrical response, such as rectification of the SPP-generated unidirectional charge density wave at the contacts and high frequency Coulomb drag effect [See 34. S. Kim, I. Jo, J. Nah, Z. Yao, S. K. Banerjee, and E. Tutuc, "Coulomb drag of massless fermions in graphene," Phys. Rev. B 83,161401(R) (2011)].

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The invention claimed is:
1. A plasmonic phototransistor, comprising:
a photon to surface-plasmon-polariton (SPP) transducer including an optical coupling structure configured to receive incident light and an electrically conducting layer having a first and a second surface, wherein said second surface is on said optical coupling structure and said electrically conducting layer generates SPPs responsive to said incident light;
a gate dielectric layer on said first surface;
a two dimensional (2D) electrically conductive material on said gate dielectric layer having electrical properties sensitive to electromagnetic fields of said SPP, and
source and drain contacts on said 2D electrically conductive material,
wherein dynamic electric fields of said SPPs reach said 2D electrically conductive material and are operable to provide electric field-induced modulation of an electrical conductance of said 2D electrically conductive material.

2. The phototransistor of claim 1, wherein said optical coupling structure comprises an optical prism coupler, wherein said second surface is opposite to said first surface and is in mechanical contact with one surface of said optical prism coupler.

3. The phototransistor of claim 1, wherein said gate dielectric layer, said 2D electrically conductive material, and said source and drain contacts are all on said first surface.

4. The phototransistor of claim 1, wherein said optical coupling structure comprises a grating coupler, wherein said grating coupler is formed in an electrically conducting medium by periodic modulation of a height or electrical conductivity of said electrically conducting medium, and said grating coupler is on top of a substrate which provides mechanical support.

5. The phototransistor of claim 1, wherein said 2D electrically conductive material comprises graphene.

6. The phototransistor of claim 1, wherein said 2D electrically conductive material comprises hexagonal boron nitride, molybdenum disulfide, molybdenum diselenide, molybdenum ditelluride, tungsten disulfide, tungsten diselenide, tungsten ditelluride, gallium selenide, gallium sulfide, phosphorene, silicene or germanene.

7. The phototransistor of claim 1, wherein said gate dielectric layer comprises multiple layers of different dielectric permittivity, and wherein at least one of said multiple layers comprise an air gap.

8. The phototransistor of claim 1, wherein said electrically conducting layer comprises a metal or metal alloy that is less than 200 nm thick.

9. The phototransistor of claim 1, wherein said plasmonic phototransistor further comprises a substrate which provides mechanical support, wherein said plasmonic phototransistor comprises a plurality of said plasmonic phototransistors arranged in an array on said substrate, and wherein said plurality of said plasmonic phototransistors include a plurality of a different geometries for said optical coupling structures to provide photodetection at a plurality of different angles of incidence for said incident light.

10. A method of spectral sensing, comprising:
providing a plasmonic phototransistor comprising a photon to surface-plasmon-polariton (SPP) transducer including and an optical coupling structure configured to receive incident light and an electrically conducting layer having a first and a second surface, wherein said second surface is on said optical coupling structure and said electrically conducting layer generates SPPs (responsive to said incident light, a gate dielectric layer on said first surface, a two dimensional (2D) electrically conductive material on said gate dielectric layer having electrical properties sensitive to electromagnetic fields of said SPP, and source and drain contacts on said 2D electrically conductive material,
directing said incident light at said second surface which generates said SPPs, wherein dynamic electric fields of said SPPs reach said 2D electrically conductive material and are operable to electric field-induce modulation of an electrical conductance of said 2D electrically conductive material, and
measuring said electrical conductance of said 2D electrically conductive material from said source and said drain contacts.

11. The method of claim 10, wherein said directing said incident light comprises aligning said incident light to provide an angle of incidence which coincides with a resonant response of said plasmonic phototransistor.

12. The method of claim 10, wherein said 2D electrically conductive material is at least semi-optically transmissive for a wavelength of said incident light.

13. The method of claim 10, wherein said optical coupling structure comprises an optical prism coupler, wherein said second surface is opposite to said first surface and is in mechanical contact with one surface of said optical prism coupler.

14. The method of claim 10, wherein said gate dielectric layer, said 2D electrically conductive material, and said source and drain contacts are all on said first surface.

15. The method of claim 10, wherein said optical coupling structure comprises a grating coupler, wherein said grating coupler is formed in an electrically conducting medium by periodic modulation of a height or electrical conductivity of said electrically conducting medium, and said grating coupler is on top of a substrate which provides mechanical support.

16. The method of claim 10, wherein said 2D electrically conductive material comprises graphene.

17. The method of claim 10, wherein said 2D electrically conductive material comprises hexagonal boron nitride, molybdenum disulfide, molybdenum diselenide, molybdenum ditelluride, tungsten disulfide, tungsten diselenide, tungsten ditelluride, gallium selenide, gallium sulfide, phosphorene, silicene or germanene.

18. The method of claim 10, wherein said gate dielectric layer comprises multiple layers of different dielectric permittivity, and where at least one of said multiple layers comprise an air gap.

19. The method of claim 10, wherein said electrically conducting layer comprises a metal or metal alloy that is less than 200 nm thick.

20. The method of claim 10, wherein said plasmonic phototransistor further comprises a substrate which provides mechanical support, wherein said plasmonic phototransistor comprises a plurality of said plasmonic phototransistors arranged in an array on said substrate, and wherein said plurality of said plasmonic phototransistors include a plurality of a different geometries for said optical coupling structures to provide photodetection at a plurality of different angles of incidence for said incident light.

* * * * *